(12) United States Patent  
Kim (10) Patent No.: US 7,435,647 B2  
(45) Date of Patent: Oct. 14, 2008

(54) NOR-TYPE FLASH MEMORY DEVICE AND MANUFACTURING METHOD THEREOF

(75) Inventor: Dong Oog Kim, Seoul (KR)

(73) Assignee: Olympus Corporation, Tokyo (JP)

( * ) Notice: Subject to any disclaimer, the term of this patent is extended or adjusted under 35 U.S.C. 154(b) by 41 days.

(21) Appl. No.: 11/315,294

(22) Filed: Dec. 23, 2005

(65) Prior Publication Data

US 2007/0010056 A1   Jan. 11, 2007

(30) Foreign Application Priority Data

Jul. 11, 2005   (KR) ..................... 10-2005-0062313

(51) Int. Cl.  
*H01L 21/336* (2006.01)

(52) U.S. Cl. ................. 438/257; 438/261; 438/262; 257/333; 257/E21.62

(58) Field of Classification Search ............... 438/201, 438/288, 573, 652, 261, 262; 257/333, 389, 257/E21.62  
See application file for complete search history.

(56) References Cited

U.S. PATENT DOCUMENTS 5,013,674 A * 5/1991 Bergemont ............... 438/201

| | | | | |
|---|---|---|---|---|
| 5,830,794 A * | 11/1998 | Kusunoki et al. | ............ | 438/266 |
| 6,204,125 B1 * | 3/2001 | Lee et al. | ............... | 438/264 |
| 6,548,334 B1 * | 4/2003 | Pham et al. | ............... | 438/196 |
| 6,878,588 B2 * | 4/2005 | Dong et al. | ............... | 438/257 |
| 6,885,586 B2 * | 4/2005 | Chen et al. | ............... | 365/185.17 |
| 2002/0126538 A1 * | 9/2002 | Chen | ............... | 365/185.28 |
| 2003/0022500 A1 * | 1/2003 | Tang | ............... | 438/692 |
| 2005/0199946 A1 * | 9/2005 | Hata et al. | ............... | 257/324 |

* cited by examiner

*Primary Examiner*—W. David Coleman  
*Assistant Examiner*—Su C Kim  
(74) *Attorney, Agent, or Firm*—Pillsbury Winthrop Shaw Pittman LLP (57) ABSTRACT

A flash memory device that has a structure capable of preventing gate stack damage, and a method of manufacturing the same, is presented. The method includes forming a first photo resist pattern to open a common source region on a substrate where a shallow trench isolation region, a tunnel oxide layer, and a gate stack including a floating gate, a dielectric layer and a control gate are formed, removing an insulating layer in the shallow trench isolation region with using the first photo resist pattern as a mask, and removing the first photo resist pattern. The method further includes depositing a buffer oxide layer on surface of the substrate to cover the gate stack and the common source region, forming a second photo resist pattern on surface of the substrate including the buffer oxide layer to open the common source region, and injecting dopants to the common source region by using the second photo resist pattern as a mask.

3 Claims, 12 Drawing Sheets

NOR-TYPE FLASH MEMORY DEVICE AND MANUFACTURING METHOD THEREOF

BACKGROUND OF THE INVENTION

1. Related Application and Priority Information

This application claims priority to and the benefit of Korean Patent Application No. 10-2005-62313 filed in the Korean Intellectual Property Office on Jul. 11, 2005, the entire contents of which are incorporated herein by reference.

2. Field of the Invention

The present invention relates to a nonvolatile memory technologies, and more specifically, to a method for manufacturing NOR flash memory devices.

3. Description of the Related Art

Semiconductor memory devices can be divided into RAM (Random Access Memory) and ROM (Read Only Memory), and the ROM devices are classified into mask ROMs and programmable ROMs (PROM). With the mask ROM, data is written or recorded when the memory is manufactured, while data in PROM can be altered by users. The PROM includes erasable PROMs (EPROMs), which allow the user to erase the data stored in the memory device by using ultraviolet source and then program it, electrically erasable PROMs (EEPROMs) that can be programmed and erased electrically, and flash memories that allow multiple memory locations to be erased or written in one programming operation.

Flash memory has a stacked gate structure comprising a floating gate and a control gate. The floating gate, placed between the control gate and the semiconductor substrate, is isolated by an insulating oxide layer. When electrons are on the floating gate, they modify the electric field coming from the control gate, which modifies the threshold voltage of the cell. Thus, when the flash memory cell is "read" by applying a specific voltage to the control gate, electrical current will either flow or not flow, depending on the threshold voltage of the cell, which is controlled by the electrons on the floating gate. This presence or absence of current is sensed and translated into 1's and 0's, reproducing the stored data. The flash memory device may be made in two forms: NOR flash and NAND flash. The NOR flash memory cells are connected in parallel between bit lines and grounds, and have common source by which sixteen cells have one common contact point and the sixteen source lines are interconnected by n+ diffusion layer.

Recently, shallow trench isolation (STI) and self-aligned source (SAS) technologies have been employed for high integration of the flash memory devices, especially for reducing the cell size along both the word line and bit line directions.

Figure 1:
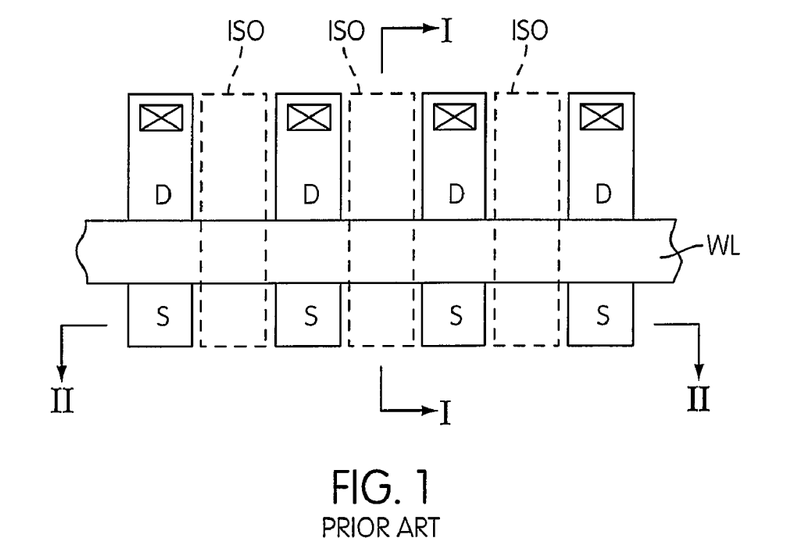
FIG. 1 is a plain view showing a structure of the conventional NOR-type flash memory cell.

FIG. 1 shows the structure of conventional NOR flash memory device to which the STI and SAS technologies have been applied. The memory cell has drain (D) and source (S) disposed at both sides of the common word line (WL), and each of the memory cells is electrically separated by an insulating layer formed in a trench of the isolation region (ISO). The sources of the memory cells are interconnected by the SAS process.

Figure 2:
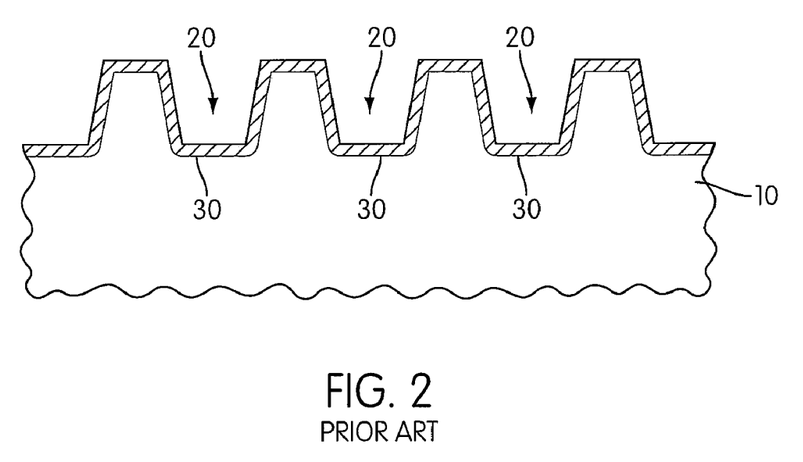
FIG. 2 is a cross-sectional view of the conventional NOR flash memory cell of FIG. 1 taken along lines II-II.
Figure 3A:
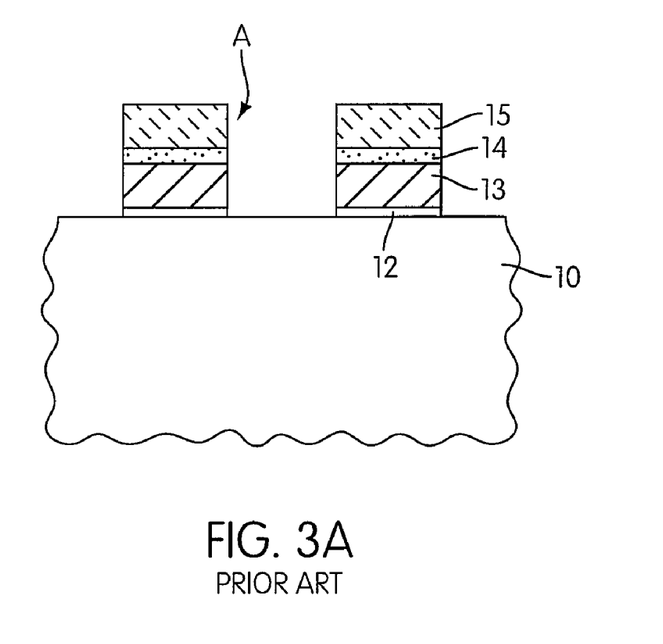
FIGS. 3A and 3B are cross-sectional views of the conventional NOR flash memory cell of FIG. 1 taken along lines I-I, before and after a SAS process, respectively.
Figure 3B:
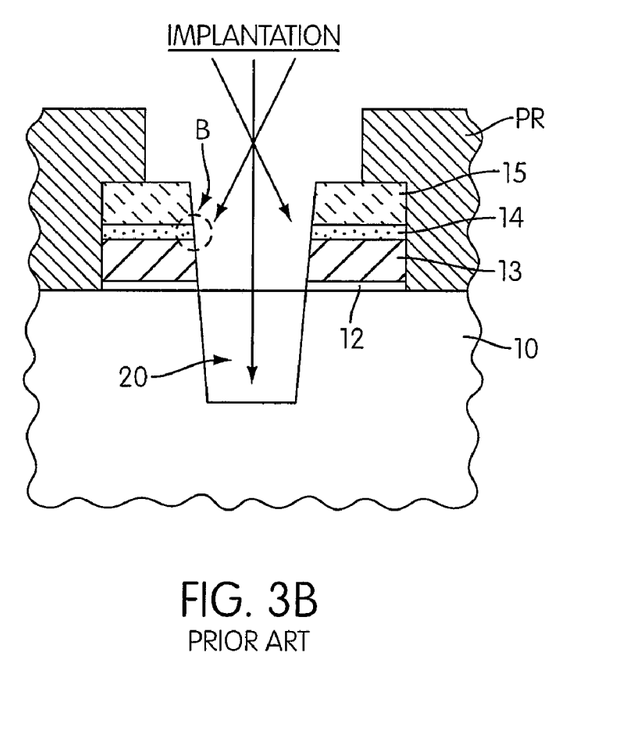

More specifically, the SAS process is carried out after forming a gate stack consisting of a tunnel oxide layer 12, a floating gate 13, a dielectric layer 14 and a control gate 15 as shown in FIGS. 3A and 3B. In the SAS process, sources of eight to sixteen bit cells are opened at the same time and the insulating layer of the ISO is removed. Thus, in the common source region, a trench 20 is formed within the substrate 10 as shown in FIG. 2. In this formed common source region, an ion implantation layer 30 is formed by ion-implanting dopants (As or P) into the substrate. The ion implantation layer 30 forms a common source line to electrically interconnect the sources of the memory cells.

According to the conventional SAS processes, the gate stack consisting of floating gate 13, dielectric layer 14 and control gate 15 experiences a profile variation during the removal of the insulating layer in the ISO, which is performed with the use of photoresist pattern for opening the common source region as a mask. In other words, as shown in FIG. 3A, the gate stack has vertical profile along cross section (A) toward the common source region before the SAS process. However, when the SAS process is performed, parts of control gate 15, dielectric layer 14, and floating gate 13 are damaged, and as shown in FIG. 3B, the gate stack has an inclined profile along the cross section. In FIG. 3B, 'PR' represents a mask pattern used in an ion implantation process.

With the inclined profile of the gate stack, the floating gate 13, dielectric layer 14 and control gate 15 may be harmed during the subsequent ion implantation process for forming the common source line. Particularly, part of dielectric layer 14 is exposed due to the inclined profile as shown in FIG. 3B, which results in dopants injection into the exposed part (B), and the dielectric capacity between the floating gate 13 and control gate 15 may be degraded. As a result, the coupling ratio is decreased and the performance of memory device may be compromised.

Moreover, the flash memory has an ability to store electrons for a long time in the gate stack consisting of floating gate, dielectric layer and control gate, and thus the damage to the gate stack has to be avoided if at all possible. With a damaged gate stack, it is not possible to guarantee the intended lifespan of the flash memory devices.

SUMMARY OF THE INVENTION

Principles of the present invention, as embodied and broadly described herein, are directed to the prevention of gate stack damage in flash memory devices. In one embodiment, a method for manufacturing a flash memory device, which has a structure capable of preventing the gate stack damage is presented.

In a first aspect, embodiments of the present invention may be directed to a method for fabricating NOR type flash memory device, comprising: (a) forming a first photo resist pattern to open a common source region on a substrate where a shallow trench isolation region, a tunnel oxide layer, and a gate stack including a floating gate, a dielectric layer and a control gate are formed; (b) removing an insulating layer in the shallow trench isolation region with using the first photo resist pattern as a mask; (c) removing the first photo resist pattern; (d) depositing a buffer oxide layer on surface of the substrate to cover the gate stack and the common source region; (e) forming a second photo resist pattern on surface of the substrate including the buffer oxide layer to open the common source region; and (f) injecting dopants to the common source region with using the second photo resist pattern as a mask.

Preferably, the buffer oxide layer has a thickness of less than about 100 Å, and the dielectric layer is ONO (Oxide-Nitride-Oxide) layer.

In a second aspect, embodiments of the present invention may be directed to a NOR type flash memory device, manufactured according to processes explained above and has a buffer oxide layer for preventing the gate stack from be damaged from SAS process and ion implantation that is for forming a common source line.

These and other aspects of embodiments of the invention will become evident by reference to the following description, often referring to the accompanying drawings.

BRIEF DESCRIPTION OF DRAWINGS

The accompanying drawings, which are incorporated in and constitute a part of this Specification, depict corresponding embodiments of the invention, by way of example only, and it should be appreciated that corresponding reference symbols indicate corresponding parts. In the drawings:

FIGS. 4a to 4F illustrate, in cross-sectional views taken along lines I-I and II-II as denoted in FIG. 1, the processes for forming a gate stack in NOR flash memory cell according to the present invention; and FIGS. 5A to 5C illustrate, in cross-sectional views taken along lines I-I as denoted in FIG. 1, the SAS process according to the present invention.

DETAILED DESCRIPTION OF EMBODIMENTS OF THE INVENTION

Hereinafter, embodiments of the present invention will be described with reference to FIGS. 4A to 4F and 5A to 5C. The NOR type flash memory of the present invention has some features that are similar to the cell structure of FIG. 1. Therefore, the embodiments of the present invention are explained with reference to cross sectional views corresponding to cross sections I-I and II-II of the conventional flash memory as shown in FIG. 1.

Figure 4A:
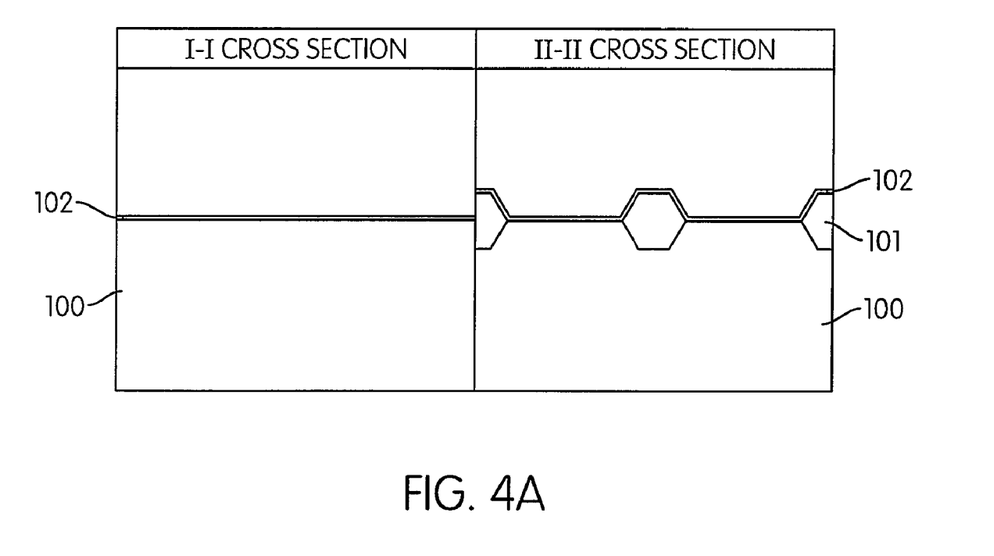
Figure 4B:
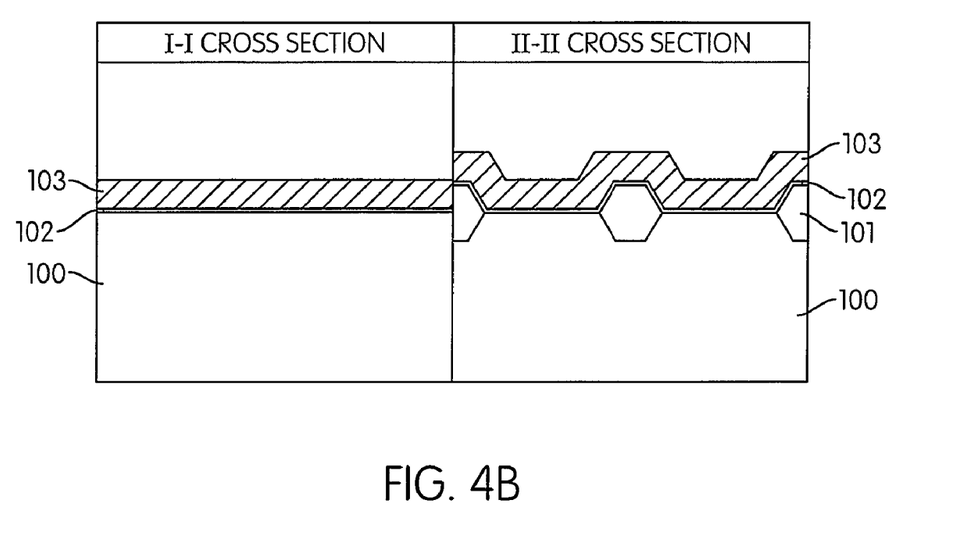
Figure 4C:
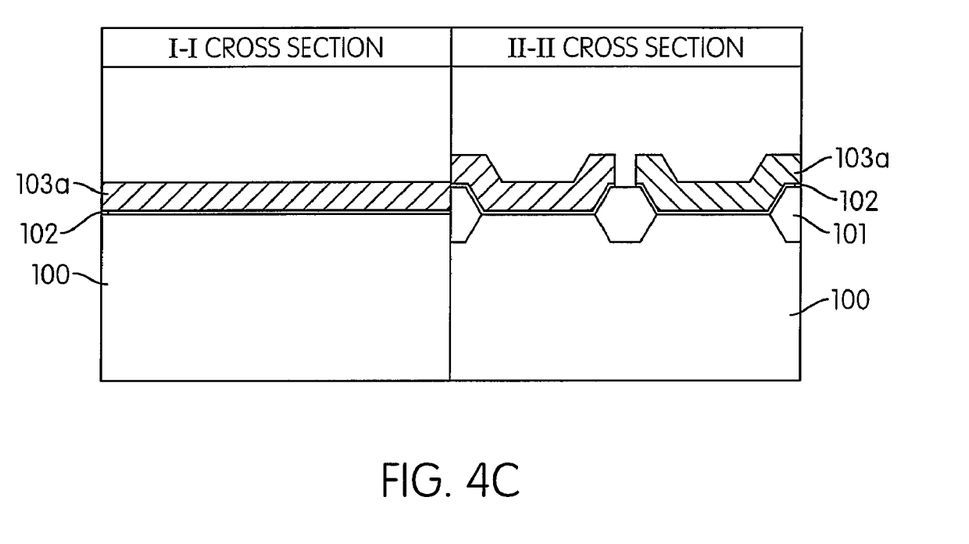

Referring to FIG. 4A, an STI 101 is formed in a semiconductor substrate 100 to define active regions and field regions. A tunnel oxide layer 102 is then formed by e.g., a thermal oxidation. On the tunnel oxide layer 102, first polysilicon layer 103 is deposited as shown in FIG. 4B. The first polysilicon layer 103 may be a doped polysilicon. As shown in FIG. 4C, the polysilicon 103 is subsequently patterned to form a floating gate 103a by a photolithographic process.

Figure 4D:
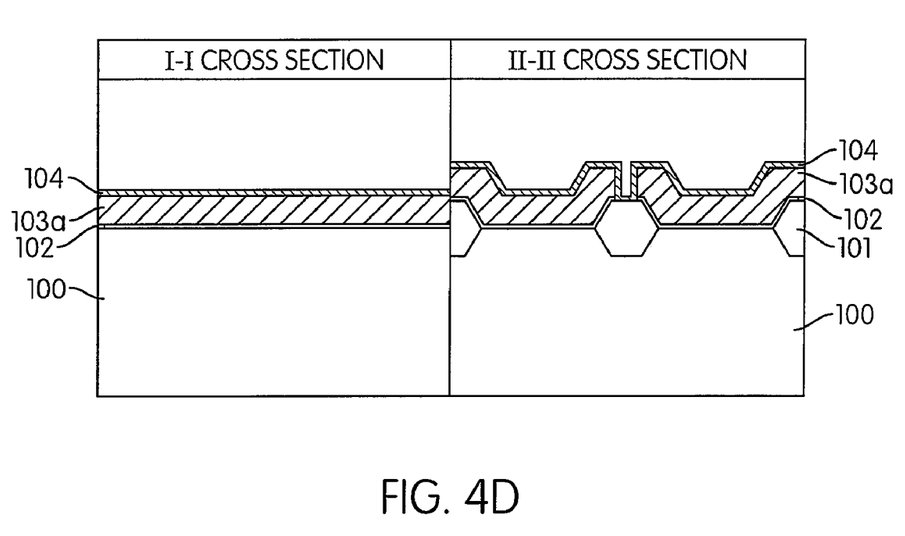
Figure 4E:
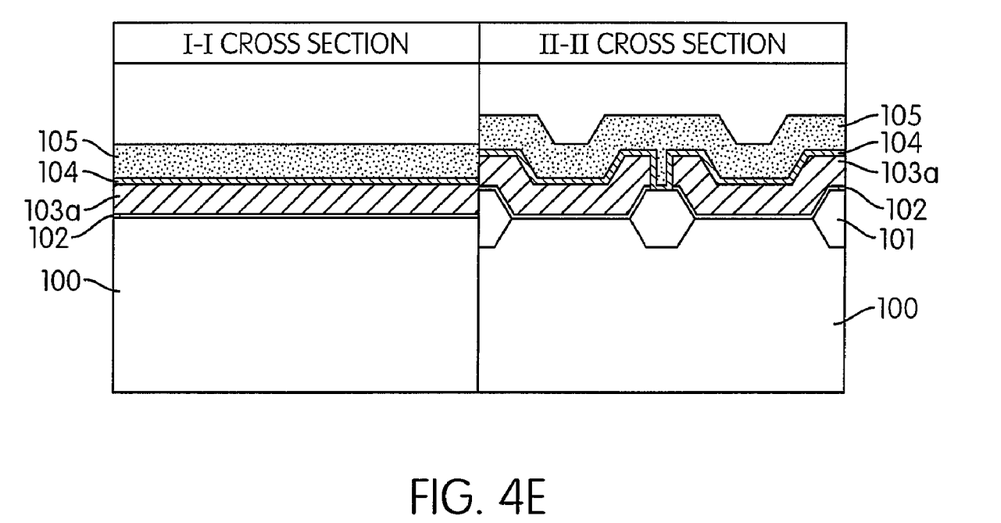

Next, an ONO (Oxide/Nitride/Oxide) layer, used for a dielectric layer 104 placed between the floating gate and a control gate, is deposited on the entire surface of the substrate as shown in FIG. 4D. After the formation of the ONO dielectric layer 104, second polysilicon layer 105 is deposited on the entire surface of the substrate 100 as shown in FIG. 4E. Like the first polysilicon layer 103, the second polysilicon layer 105 may be a doped polysilicon. The second polysilicon 105 and dielectric layer 104 are then patterned to form a control gate 105a.

Figure 4F:
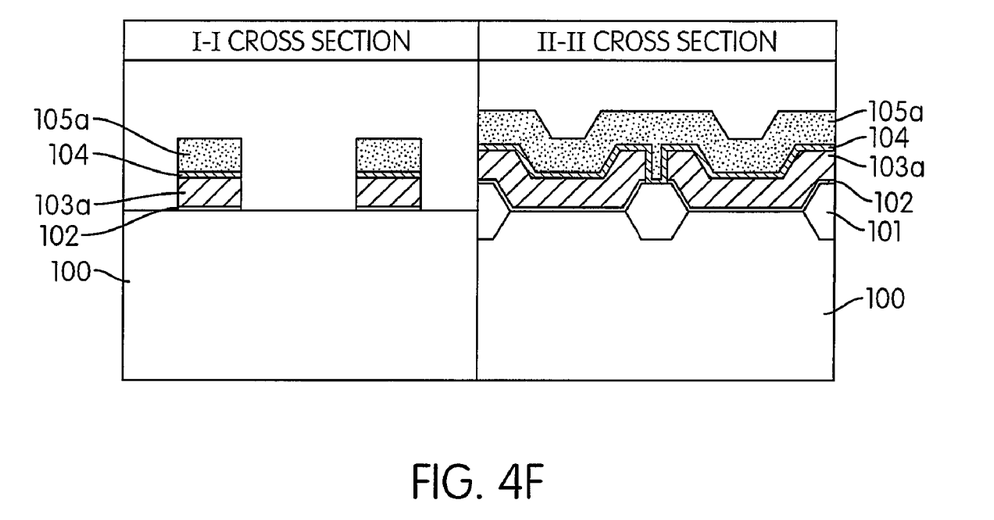

With the gate stack consisting of floating gate 103a, dielectric layer 104 and control gate 105a, the cross section of the gate stack along the bit line in cell region has the shape of cross section taken along lines I-I of FIG. 4F.

Now with reference to FIGS. 5A to 5C, embodiments consistent with the SAS process of the present invention will be described. The SAS process is carried out with a first photo resist pattern (PR1) to make the common source region open.

Figure 5A:
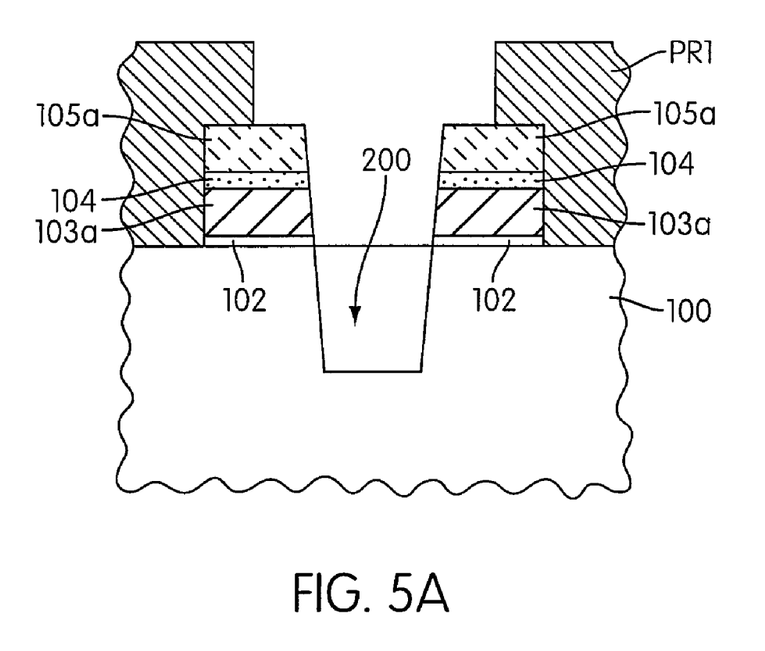
Figure 5B:
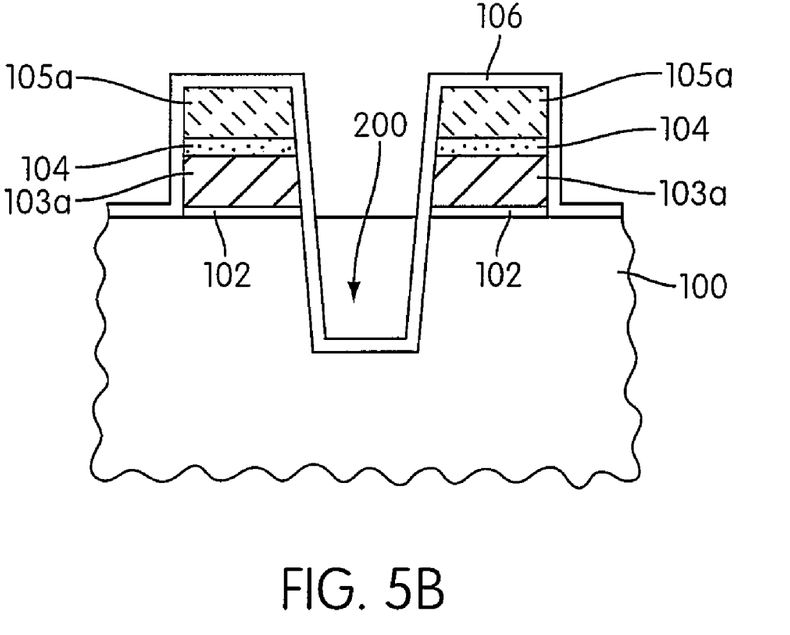

As depicted in FIG. 5A, the insulating layer in the STI 101 is removed to form a trench 200. When conventional SAS processes are performed on this structure, the floating gate 103a, dielectric layer 104, and control gate 105a may be damaged, as explained above with reference to FIGS. 3A, 3B. However, the damage of the gate stack may be prevented by the SAS process of the present invention. That is, the first photo resist pattern (PR1) is removed and a cleaning process is performed. A buffer oxide layer 106 is deposited on the entire surface of substrate 100 including the gate stack, as shown in FIG. 5B. In this manner, the deposited buffer oxide layer 106 covers the substrate surface in the common source region and the gate stack 103a, 104 and 105a. The buffer oxide layer 106 may be formed by various methods including high temperature oxidation and chemical vapor deposition (CVD). With the buffer oxide layer 106, the gate stack can be cured from lattice defect that may be generated during the SAS etching process.

Figure 5C:
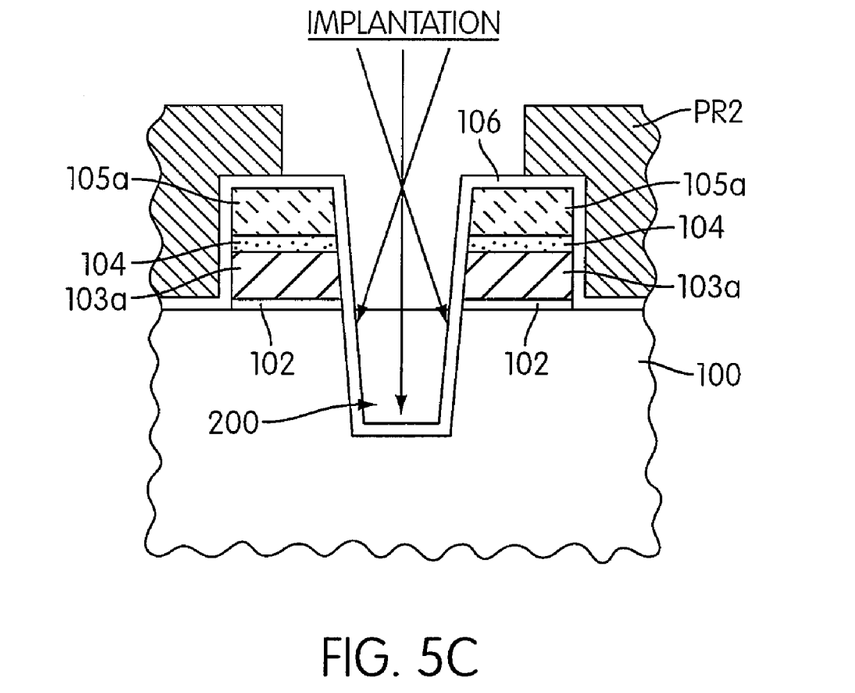

Referring to FIG. 5C, second photo resist pattern (PR2), which opens the common source region, is formed on the substrate 100. Dopants such as As (Arsenic) or P (Phosphorous) are injected into the substrate in the common source region by an ion implantation process to form a common source line that electrically interconnects the sources of each of the flash memory cells.

During the ion implantation process, the buffer oxide layer 106 protects the gate stack from the dopants. If the thickness of the buffer oxide layer 106 is too great, the source junction may not be formed to a predetermined level. Further, excessive energy for injecting the dopants may harm the memory cell. With this said, it is preferable to keep the thickness of the buffer oxide 106 to be less than about 100 Å. Further, the buffer oxide 106 has a thickness enough to prevent the damage of gate stack from the injected dopants.

Next, the second photo resist pattern (PR2) is removed and the substrate 100 is cleaned. Subsequently, conventional processes for logic devices are carried out to form a flash memory device.

In this manner, a flash memory device may be manufactured with a structure that is resistant to gate stack damage.

While the invention has been shown and described with reference to certain preferred embodiments thereof, it will be understood by those skilled in the art that various changes in form and details may be made therein without departing from the spirit and scope of the invention as defined by the appended claims. For instance, in the embodiments explained above the SAS process is carried out after the formation of the gate stack. However, the ion implantation process for forming the source and drain junction may be performed after the formation of the gate stack and before the formation of the common source line by the SAS process.

What is claimed is:

1. A method of manufacturing a NOR-type flash memory device, comprising:

forming a first photoresist pattern to open a common source region on a substrate where a shallow trench isolation region, a tunnel oxide layer, and a gate stack that includes a floating gate, a dielectric layer and a control gate, are formed;

forming a trench in the common source region by removing an insulating layer in the shallow trench isolation region by using the first photo resist pattern as a mask;

removing the first photo resist pattern;

depositing a buffer oxide layer on a surface of the substrate to cover the gate stack and the trench;

forming a second photo resist pattern on surface of the substrate including the buffer oxide layer to open the buffer oxide layer formed on the trench; and forming the common source region by injecting dopants into the trench which the buffer oxide layer covered using the second photo resist pattern as a mask.

2. The method of claim 1, wherein the dielectric layer is oxide-nitride-oxide layer.

3. A NOR type flash memory device, comprising:
   a Substrate having a shallow trench isolation region;
   a tunnel oxide layer disposed on untrenched portions of the substrate;
   a gate stack disposed on the tunnel oxide layer, the gate stack including a floating gate, a dielectric layer, and a control gate;
   a buffer oxide layer having a thickness of less than 100 Å disposed on surfaces of the floating gate, dielectric layer, control gate and the trench isolation layer;
   a common source region formed subsequent to said disposing of said buffer oxide layer, and
   a common source line that electrically interconnects sources of each of a plurality of flash memory cells, wherein dopants are injected into the common source region
   wherein the buffer oxide layer prevents the gate stack from being damaged from a self-aligned source (SAS) process and an ion implantation process which form the common source line.

* * * * *

UNITED STATES PATENT AND TRADEMARK OFFICE
CERTIFICATE OF CORRECTION

| | | |
|---|---|---|
| PATENT NO. | : 7,435,647 B2 | Page 1 of 1 |
| APPLICATION NO. | : 11/315294 | |
| DATED | : October 14, 2008 | |
| INVENTOR(S) | : Kim | |

It is certified that error appears in the above-identified patent and that said Letters Patent is hereby corrected as shown below:

On title page, item [73] Assignees:

replace "Olympus Corporation, Tokyo (JP)"

with -- Dongbu Electronics Co., Ltd., Seoul, (KR) --

Signed and Sealed this
Twenty-fifth Day of March, 2014

Michelle K. Lee
*Deputy Director of the United States Patent and Trademark Office*